(12) United States Patent
Nishino et al.

(10) Patent No.: US 10,707,264 B2
(45) Date of Patent: Jul. 7, 2020

(54) IMAGE SENSOR AND IMAGING APPARATUS

(71) Applicant: SONY CORPORATION, Tokyo (JP)

(72) Inventors: Tatsuki Nishino, Kanagawa (JP); Yosuke Ueno, Kanagawa (JP); Yusuke Moriyama, Kanagawa (JP); Shizunori Matsumoto, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/318,164

(22) PCT Filed: Jun. 9, 2017

(86) PCT No.: PCT/JP2017/021441
§ 371 (c)(1),
(2) Date: Jan. 16, 2019

(87) PCT Pub. No.: WO2018/020858
PCT Pub. Date: Feb. 1, 2018

(65) Prior Publication Data
US 2019/0288029 A1    Sep. 19, 2019

(30) Foreign Application Priority Data

Jul. 29, 2016   (JP) .................................. 2016-150068

(51) Int. Cl.
*H01L 27/148*     (2006.01)
*H01L 27/146*     (2006.01)
(Continued)

(52) U.S. Cl.
CPC .. *H01L 27/14812* (2013.01); *H01L 27/14609* (2013.01); *H04N 5/341* (2013.01);
(Continued)

(58) Field of Classification Search
CPC ........ H01L 27/14609; H01L 27/14812; H04N 5/341; H04N 5/357; H04N 5/3577;
(Continued)

(56) References Cited

U.S. PATENT DOCUMENTS

2006/0001564 A1\* 1/2006 Yamagata ........... H03M 1/0619
341/169
2007/0024726 A1\* 2/2007 Nomoto ................. H04N 5/378
348/308

(Continued)

FOREIGN PATENT DOCUMENTS

JP    2005-094240 A    4/2005
JP    2006-020172 A    1/2006
(Continued)

OTHER PUBLICATIONS

International Search Report and Written Opinion of PCT Application No. PCT/JP2017/021441, dated Aug. 8, 2017, 07 pages of ISRWO.

*Primary Examiner* — Amy R Hsu
(74) *Attorney, Agent, or Firm* — Chip Law Group

(57) ABSTRACT

To prevent a decline in image quality by reducing a fluctuation in an image signal that is based on a fluctuation in a voltage of a negative voltage power source.
An image signal output unit is controlled in accordance with a first control signal indicating either voltage state of an on voltage for causing a conductive state and an off voltage having a polarity different from that of the on voltage, and outputs an analog image signal corresponding to the electric charge held by an electric charge holding unit in the conductive state. A reset unit is controlled in accordance with a second control signal indicating either voltage state of the on voltage and the off voltage, resets the electric charge holding unit in the conductive state, transmits a fluctuation in the off voltage to the electric charge holding unit, and fluctuates the (Continued)

analog image signal. A reference signal generation unit generates a reference signal being a signal serving as a reference used when conversion from an analog image signal output from the image signal output unit into a digital image signal is performed. A reference signal correction unit corrects the generated reference signal in accordance with the fluctuation in the off voltage. An analog-to-digital conversion unit performs the conversion on the basis of the corrected reference signal.

6 Claims, 11 Drawing Sheets

(51) Int. Cl.
*H04N 5/341* (2011.01)
*H04N 5/372* (2011.01)
*H04N 5/374* (2011.01)
*H04N 5/357* (2011.01)

(52) U.S. Cl.
CPC ............. *H04N 5/357* (2013.01); *H04N 5/372* (2013.01); *H04N 5/374* (2013.01)

(58) Field of Classification Search
CPC ...... H04N 5/372; H04N 5/374; H04N 5/3745; H04N 5/376; H04N 5/378
See application file for complete search history.

(56) References Cited

U.S. PATENT DOCUMENTS

| | | | |
|---|---|---|---|
| 2010/0079611 A1* | 4/2010 | Suzuki | H04N 5/374 348/222.1 |
| 2010/0253560 A1* | 10/2010 | Kudo | H03K 4/02 341/143 |
| 2016/0301886 A1* | 10/2016 | Muto | H04N 5/378 |

FOREIGN PATENT DOCUMENTS

| | | |
|---|---|---|
| JP | 2006-319684 A | 11/2006 |
| JP | 2009-117613 A | 5/2009 |

* cited by examiner

IMAGE SENSOR AND IMAGING APPARATUS

CROSS REFERENCE TO RELATED APPLICATIONS

This application is a U.S. National Phase of International Patent Application No. PCT/JP2017/021441 filed on Jun. 9, 2017, which claims priority benefit of Japanese Patent Application No. JP 2016-150068 filed in the Japan Patent Office on Jul. 29, 2016. Each of the above-referenced applications is hereby incorporated herein by reference in its entirety.

TECHNICAL FIELD

The present technology relates to an image sensor and an imaging apparatus. More particularly, the present technology relates to an image sensor and an imaging apparatus that include a pixel circuit controlled in accordance with a control signal.

BACKGROUND ART

As an image sensor used in a camera or the like, a complementary metal oxide semiconductor (CMOS)-type image sensor has been conventionally used. The image sensor includes a plurality of pixels each including a photoelectric conversion element that generates an image signal corresponding to emitted light. In recent years, a lower voltage of a power source has been achieved for reducing power consumption of a camera or the like, and there is a growing demand for a lower voltage also in an image sensor. Nevertheless, when a power source voltage of a pixel declines, there is such a problem that a dynamic range of a photoelectric conversion element becomes narrower, and the pixel becomes susceptible to the effect of noise. In view of the foregoing, there is proposed a system that reduces the effect of noise by applying a negative voltage as a reference voltage of a photoelectric conversion element, widening a dynamic range, and arranging a depression-type MOS transistor to be driven by the negative voltage, in a pixel (e.g. refer to Patent Literature 1.).

CITATION LIST

Patent Literature

Patent Literature 1: JP 2009-117613A

DISCLOSURE OF INVENTION

Technical Problem

In the above-described conventional technology, a negative power source that supplies a negative voltage is required. The negative power source is arranged in an image sensor as a local regulator. As described above, an output of a negative power source is used also for driving of a MOS transistor arranged in a pixel. Thus, when an output voltage of a negative power source fluctuates due to a load fluctuation or the like, the fluctuation affects an image signal via a parasitic capacitance of the MOS transistor, and the image signal fluctuates. By adding a high-capacity capacitor to an output of the negative power source, a fluctuation in an output voltage can be reduced. Nevertheless, in this case, there arises such a problem that, because the high-capacity capacitor is arranged, an image sensor and an imaging apparatus cannot be downsized.

The present technology has been devised in view of such a situation, and the object of the present technology is to prevent a decline in image quality by reducing a fluctuation in an image signal that is based on a fluctuation in a voltage of a negative voltage power source, while downsizing an image sensor.

Solution to Problem

The present technology has been devised to solve the problem described above, and a first aspect thereof is an image sensor including: an electric charge holding unit configured to hold an electric charge generated in accordance with light emitted for each pixel; an image signal output unit configured to be controlled in accordance with a first control signal indicating either voltage state of an on voltage for causing a conductive state and an off voltage having a polarity different from that of the on voltage, and output an analog image signal corresponding to the held electric charge in the conductive state; a reset unit configured to be controlled in accordance with a second control signal indicating either voltage state of the on voltage and the off voltage, reset the electric charge holding unit in the conductive state, transmit a fluctuation in the off voltage to the electric charge holding unit, and fluctuate the analog image signal; a reference signal generation unit configured to generate a reference signal being a signal serving as a reference used when conversion from an analog image signal output from the image signal output unit into a digital image signal is performed; a reference signal correction unit configured to correct the generated reference signal in accordance with the fluctuation in the off voltage; and an analog-to-digital conversion unit configured to perform the conversion on the basis of the corrected reference signal. This causes such an operation that the reference signal is corrected in accordance with a fluctuation in the analog image signal that is based on the fluctuation in the off voltage.

In addition, according to the first aspect, the reset unit may transmit the fluctuation in the off voltage to the electric charge holding unit via a parasitic capacitance of itself. This causes such an operation that the fluctuation in the off voltage is transmitted via the parasitic capacitance.

In addition, according to the first aspect, the reference signal correction unit may correct the generated reference signal in accordance with a fluctuation in a voltage of a power source that supplies the off voltage. This causes such an operation that the reference signal is corrected in accordance with the fluctuation in the voltage of the power source that supplies the off voltage.

In addition, according to the first aspect, the analog-to-digital conversion unit may include a comparison unit configured to perform detection of match between the analog image signal and the reference signal by comparing the analog image signal and the reference signal, and a count unit configured to perform counting in a period from a start of the comparison to the detection in the comparison unit, and output a count value as the digital image signal. This causes such an operation that a count value obtained when the corrected reference signal and the analog image signal match is output as the digital image signal.

In addition, according to the first aspect, a plurality of pixels arranged in a matrix and each including the image signal output unit; and a plurality of the analog-to-digital conversion units each configured to perform the conversion on the analog image signals output from the respective image signal output units of a plurality of the pixels arranged in one row may be included. The reference signal correction unit may supply the same corrected reference signal to each of the plurality of analog-to-digital conversion units. This causes such an operation that the same reference signal is supplied to the respective image signal output units of the plurality of pixels arranged in one row.

In addition, a second aspect of the present technology is an imaging apparatus including: an electric charge holding unit configured to hold an electric charge generated in accordance with light emitted for each pixel; an image signal output unit configured to be controlled in accordance with a first control signal indicating either voltage state of an on voltage for causing a conductive state and an off voltage having a polarity different from that of the on voltage, and output an analog image signal corresponding to the held electric charge in the conductive state; a reset unit configured to be controlled in accordance with a second control signal indicating either voltage state of the on voltage and the off voltage, reset the electric charge holding unit in the conductive state, transmit a fluctuation in the off voltage to the electric charge holding unit, and fluctuate the analog image signal; a reference signal generation unit configured to generate a reference signal being a signal serving as a reference used when conversion from an analog image signal output from the image signal output unit, into a digital image signal is performed; a reference signal correction unit configured to correct the generated reference signal in accordance with the fluctuation in the off voltage; an analog-to-digital conversion unit configured to perform the conversion on the basis of the corrected reference signal; and a processing circuit configured to process a digital image signal on which the conversion has been performed. This causes such an operation that the reference signal is corrected in accordance with a fluctuation in the analog image signal that is based on the fluctuation in the off voltage.

Advantageous Effects of Invention

According to the present technology, such an excellent effect that a decline in image quality is prevented by reducing a fluctuation in an image signal that is based on a fluctuation in a voltage of a negative voltage power source can be caused. Note that the effects described here are not always limited, and any of the effects described in the present disclosure may be caused.

MODE(S) FOR CARRYING OUT THE INVENTION

Hereinafter, a mode for carrying out the present technology (hereinafter, referred to as an embodiment) will be described. The description will be given in the following order.
1. Configuration of Embodiment
2. Operation of Embodiment 1. Operation of Embodiment

[Configuration of Imaging Apparatus]

Figure 1:
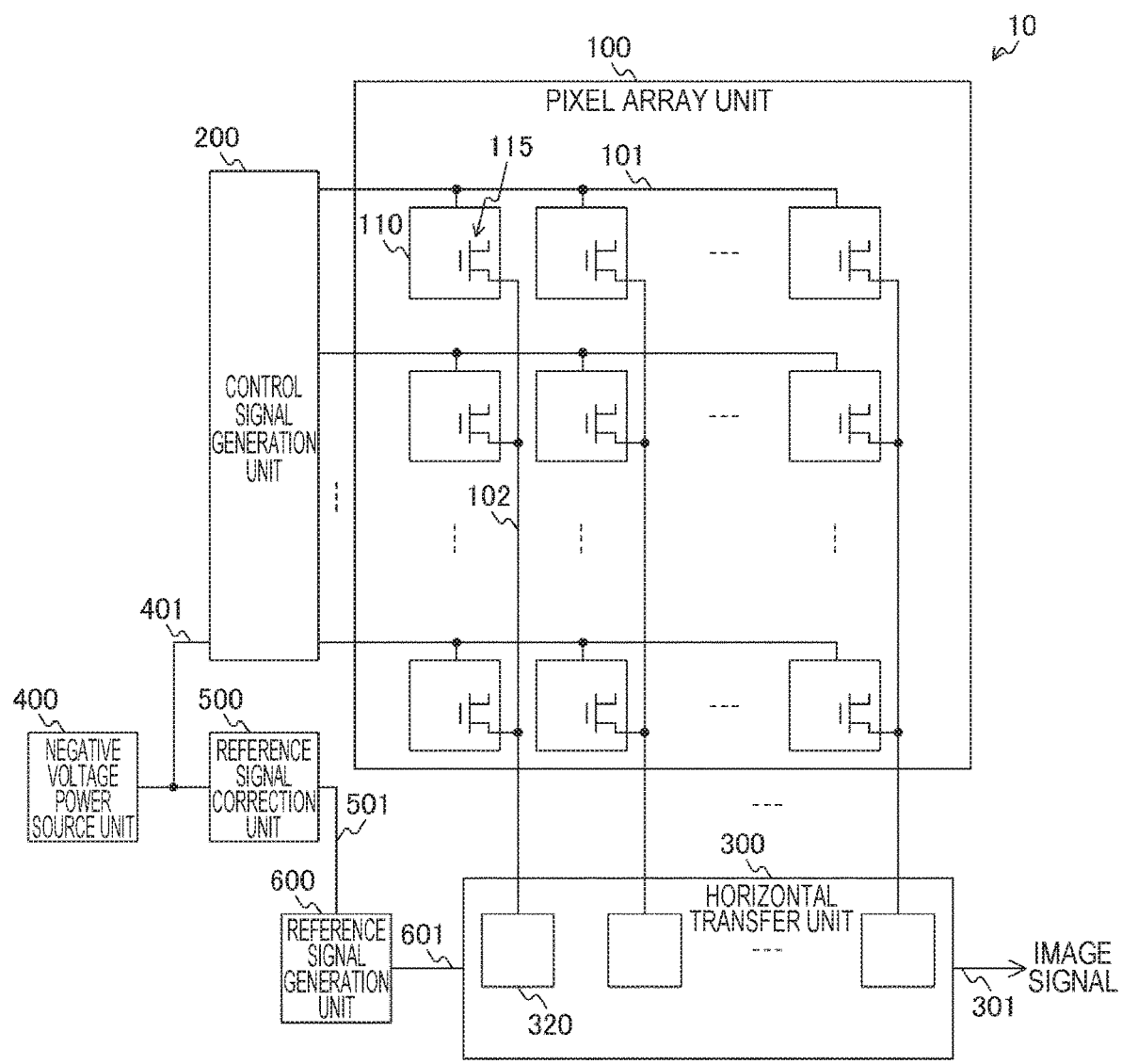
FIG. 1 is a diagram illustrating a configuration example of an imaging apparatus 10 in an embodiment of the present technology.

FIG. 1 is a diagram illustrating a configuration example of an imaging apparatus 10 in an embodiment of the present technology. The imaging apparatus 10 includes a pixel array unit 100, a control signal generation unit 200, a horizontal transfer unit 300, a negative voltage power source unit 400, a reference signal correction unit 500, and a reference signal generation unit 600.

The pixel array unit 100 includes pixels 110 that are arranged in a two-dimensional matrix and each generate an image signal corresponding to emitted light. The pixel array outputs image signals generated by the plurality of pixels 110, to the horizontal transfer unit 300. In the pixel array unit 100, signal lines 101 that transmit control signals to the plurality of pixels 110 and signal lines 102 that transmit image signals output from the pixels 110 are arranged in an XY matrix and laid with respect to the pixels 110. The signal line 101 is laid for each of the rows of the plurality of pixels 110. In addition, the signal line 101 is laid in common to the pixels 110 arranged in one row. In other words, control signals different for the respective rows are input to the pixels 110, and a common control signal is input to the pixels 110 arranged in one row. On the other hand, the signal line 102 is laid for each of the columns of the plurality of pixels 110. In addition, the signal line 102 is laid in common to the pixels 110 arranged in one column. In other words, image signals of the pixels 110 arranged in one column are transmitted via a common signal line 102.

In addition, each of the pixels 110 in this drawing includes an image signal output unit 115. The image signal output unit 115 outputs an image signal corresponding to light emitted for each of the pixels 110, to the signal line 102. The image signal is an analog image signal, and is converted into a digital image signal in the horizontal transfer unit 300 to be described later. In addition, the image signal output unit 115 is controlled in accordance with a control signal generated by the control signal generation unit 200. The details of the configuration of the pixels 110 will be described later.

The control signal generation unit 200 generates control signals for controlling the pixels 110. The control signal generation unit 200 generates control signals to be applied to control terminals of MOS transistors arranged in the pixels 110 that are to be described later, and outputs the control signals via the signal lines 101. The control signals are signals for applying an on voltage that brings the MOS transistors into a conductive state, and an off voltage having a polarity different from that of the on voltage. By applying the off voltage, a nonconductive state of the MOS transistors can be assured. Specifically, voltages having positive and negative polarities can be respectively applied as the on voltage and the off voltage. The details of the control signals generated by the control signal generation unit 200 will be described later.

The horizontal transfer unit 300 processes analog image signals generated by the pixels 110. A plurality of analog image signals generated by the pixels 110 arranged in one row of the pixel array unit 100 are simultaneously input to the horizontal transfer unit 300. In addition, the horizontal transfer unit 300 includes a plurality of analog-to-digital conversion units 320 that perform analog-to-digital conversion. The input analog image signals are converted into digital image signals by the plurality of analog-to-digital conversion units 320, and output via a signal line 301. The details of the configuration of the horizontal transfer unit 300 will be described later.

The negative voltage power source unit 400 supplies negative-polarity power. The negative-polarity power is supplied to the control signal generation unit 200 via a power line 401 and is used for the generation of the above-described negative off voltage. In addition, the negative-polarity power is supplied also to the reference signal correction unit 500 to be described later.

The reference signal generation unit 600 generates a reference signal and outputs the reference signal to the horizontal transfer unit 300. Here, the reference signal is a signal serving as a reference used when analog-to-digital conversion of an analog image signal is performed. A signal with a voltage varying in a ramp shape can be used as the reference signal. The reference signal generation unit 600 outputs the reference signal via a signal line 601. The details of the configuration of the reference signal generation unit 600 will be described later.

The reference signal correction unit 500 corrects the reference signal generated by the reference signal generation unit 600. When the off voltage of the control signal generated by the control signal generation unit 200 fluctuates, the reference signal correction unit 500 varies the reference signal in accordance with the fluctuation, thereby correcting the reference signal. As described later, when image signals are output from the pixels 110, a voltage of power supplied from the negative voltage power source unit 400 fluctuates due to the influence of a load fluctuation or the like. The off voltage thereby fluctuates in a similar manner. Because the fluctuation in the off voltage propagates to the pixels 110 and influences image signals via parasitic capacitances of the pixels 110, the image signal fluctuate. The reference signal correction unit 500 detects the fluctuation in the off voltage and corrects the reference signal in accordance with the fluctuation, thereby cancelling a fluctuation in the image signals. The detection of the fluctuation in the off voltage can be performed by, for example, detecting a fluctuation in a voltage of power supplied from the negative voltage power source unit 400. The reference signal correction unit 500 in the drawing performs correction of the reference signal by outputting a correction signal for correcting the reference signal, to the reference signal generation unit 600 via a signal line 501. The details of the configuration of the reference signal correction unit 500 and the correction will be described later.

[Configuration of Pixel]

Figure 2:
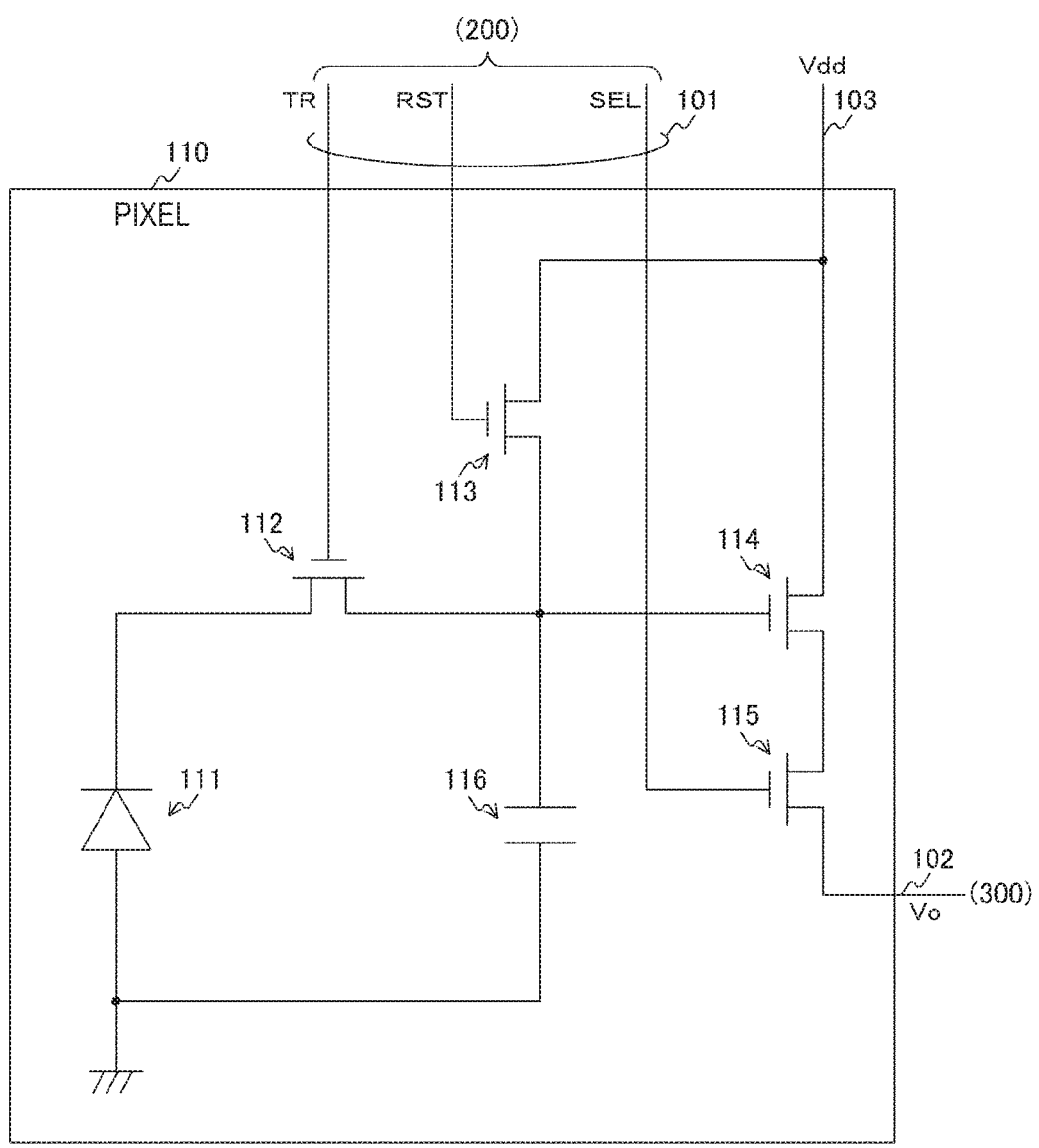
FIG. 2 is a diagram illustrating a configuration example of a pixel 110 in an embodiment of the present technology.

FIG. 2 is a diagram illustrating a configuration example of the pixel 110 in an embodiment of the present technology. The pixel 110 includes a photoelectric conversion unit 111, an electric charge transfer unit 112, a reset unit 113, an image signal generation unit 114, the image signal output unit 115, and an electric charge holding unit 116. Among these units, the electric charge transfer unit 112, the reset unit 113, the image signal generation unit 114, and the image signal output unit 115 can be formed by MOS transistors. In addition, in the pixel 110, the signal lines 101 and 102 described in FIG. 1 are laid. Among these signal lines, the signal lines 101 include a transfer signal line TR (Transfer), a reset signal line RST (Reset), and a selection signal line SEL (Select). These signal lines are connected to gates of MOS transistors, and transmit the control signals described in FIG. 1. Aside from these, the power line 103 is laid in the pixel 110. The power line supplies positive-polarity power Vdd. Note that Vdd is supplied by a power source unit (not illustrated in FIG. 1).

An anode of the photoelectric conversion unit 111 is grounded, and a cathode thereof is connected to a source of the electric charge transfer unit 112. A gate of the electric charge transfer unit 112 is connected to the transfer signal line TR, and a drain thereof is connected to a source of the reset unit 113, a gate of the image signal generation unit 114, and one end of the electric charge holding unit 116. Another end of the electric charge holding unit 116 is grounded. A gate of the reset unit 113 is connected to the reset signal line RST, and a drain thereof is connected to the power line 103. A drain of the image signal generation unit 114 is connected to the power line 103, and a source thereof is connected to a drain of the image signal output unit 115. A gate of the image signal output unit 115 is connected to the selection signal line SEL, and a source thereof is connected to the signal lines 102.

The photoelectric conversion unit 111 performs photoelectric conversion. The photoelectric conversion unit 111 generates an electric charge corresponding to light emitted to the pixel 110, by photoelectric conversion, and holds the electric charge. A photodiode can be used as the photoelectric conversion unit 111.

The electric charge transfer unit 112 transfers the electric charge generated and held by the photoelectric conversion unit 111, to the electric charge holding unit 116. The electric charge transfer unit 112 transfers the electric charge by causing a conductive state between the photoelectric conversion unit 111 and the electric charge holding unit 116. In addition, the electric charge transfer unit 112 is controlled in accordance with a control signal input from the transfer signal line TR. A signal similar to the control signal of the image signal output unit 115 that is to be described later can be used as the control signal.

The electric charge holding unit 116 holds the electric charge transferred by the electric charge transfer unit 112. A floating diffusion formed in a diffusion layer of a semiconductor substrate can be used as the electric charge holding unit 116.

The image signal generation unit 114 generates an image signal corresponding to the electric charge held in the electric charge holding unit 116.

The image signal output unit 115 outputs the image signal generated by the image signal generation unit 114. The image signal output unit 115 performs outputting of the image signal via the signal line 102. In addition, the image signal output unit 115 is controlled in accordance with a control signal input from the selection signal line SEL. As the control signal, a first control signal indicating either voltage state of the on voltage and the off voltage can be used. Here, the on voltage is a voltage that brings a MOS transistor forming the image signal output unit 115, into the conductive state. As the on voltage, a voltage that is equal to or larger than a threshold voltage between a gate and a source of the MOS transistor can be adopted. By applying the on voltage to the gate, the MOS transistor enters the conductive state. In other words, the conductive state is caused between the source of the image signal generation unit 114 and the signal line 102, and an image signal (Vo) is output. As illustrated in the drawing, in a case where an N-channel MOS transistor is used as the image signal output unit 115, a positive-polarity on voltage can be applied.

On the other hand, the off voltage is a voltage that brings the MOS transistor forming the image signal output unit 115, into a nonconductive state. By setting a voltage between the gate and the source of the MOS transistor, to a voltage smaller than a threshold, the MOS transistor can be brought into the nonconductive state. A voltage having a polarity different from that of the on voltage can be applied as the off voltage. Specifically, a negative-polarity off voltage can be applied to a positive-polarity on voltage. This can assure the nonconductive state of the image signal output unit 115.

The reset unit 113 discharges and resets the electric charge held in the electric charge holding unit 116. By conducting electricity between the electric charge holding unit 116 and the power line 103, the reset unit 113 performs the discharge of the electric charge. At this time, by conducting electricity in the electric charge transfer unit 112, the reset of the photoelectric conversion unit 111 can be performed. The reset unit 113 is controlled in accordance with a control signal input from the reset signal line SEL. As the control signal, a second control signal indicating either voltage state of the on voltage and the off voltage can be used similarly to the control signal of the image signal output unit 115.

[Configuration of Horizontal Transfer Unit]

Figure 3:
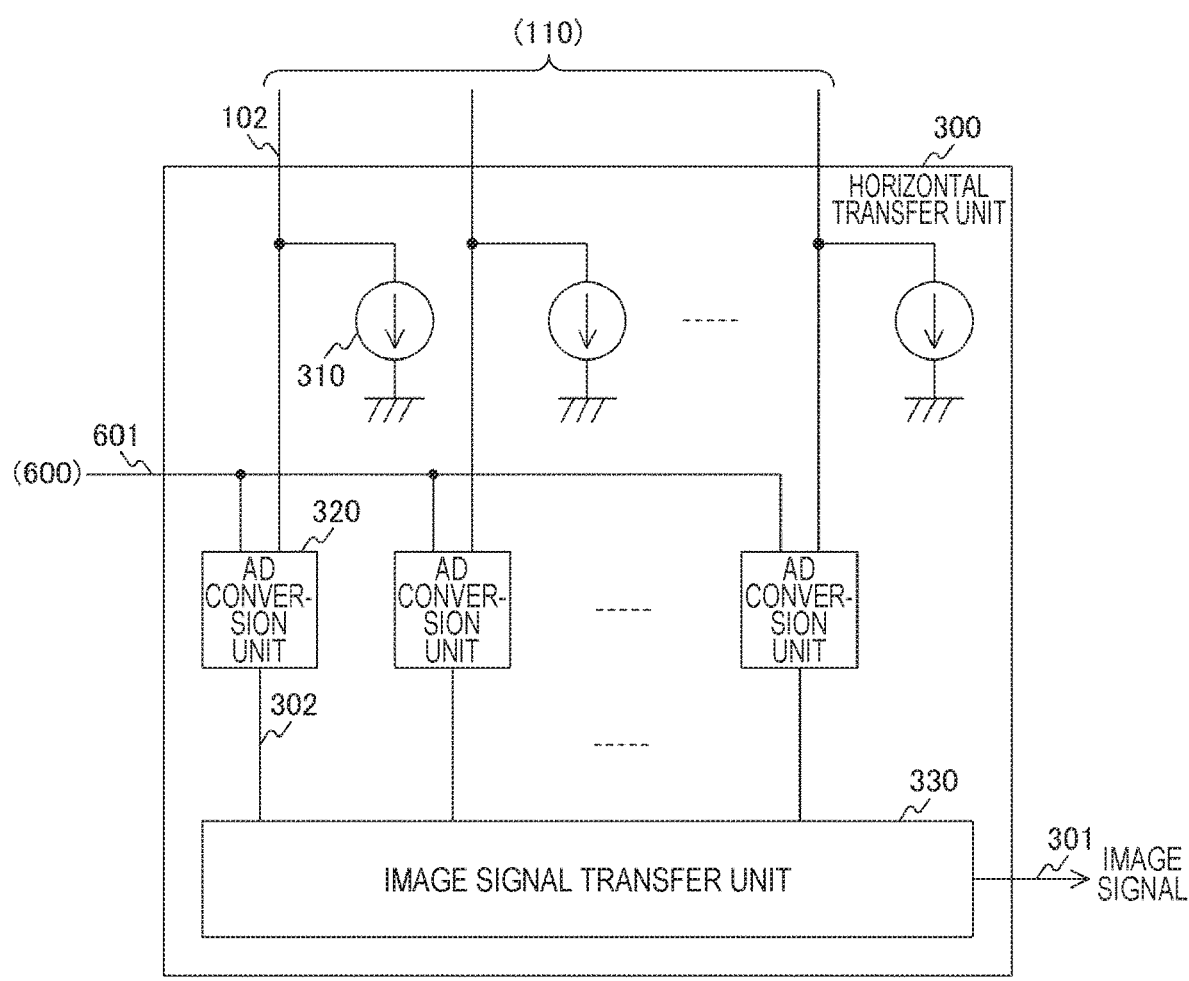
FIG. 3 is a diagram illustrating a configuration example of a horizontal transfer unit 300 in an embodiment of the present technology.

FIG. 3 is a diagram illustrating a configuration example of the horizontal transfer unit 300 in an embodiment of the present technology. The horizontal transfer unit 300 includes a constant electric current power source 310, an analog-to-digital (AD) conversion unit 320, and an image signal transfer unit 330. The constant electric current power source 310 and the analog-to-digital conversion unit 320 are arranged for each of the signal lines 102. In other words, these are each arranged as many as the number of columns of the pixels 110 arranged in the pixel array unit 100.

The constant electric current power source 310 is arranged between the signal line 102 and a ground, and forms a constant electric current load of the image signal output unit 115 of the pixel 110. In other words, the image signal output unit 115 and the constant electric current power source 310 form a source follower circuit.

The analog-to-digital conversion unit 320 performs analog-to-digital conversion of an analog image signal output from the image signal output unit 115. The analog-to-digital conversion unit 320 performs the analog-to-digital conversion of the image signal on the basis of a reference signal. The analog-to-digital conversion unit 320 in the drawing performs the analog-to-digital conversion on the basis of a reference signal corrected by the reference signal correction unit 500. As illustrated in the drawing, a reference signal is input in common to the analog-to-digital conversion units 320. In other words, the same reference signal is supplied to the analog-to-digital conversion units 320. This can apply the same correction to image signals output from the pixels 110 arranged in one row. The converted digital image signals are output to the image signal transfer unit 330 via a signal line 302. The details of the configuration of the analog-to-digital conversion unit 320 will be described later.

The image signal transfer unit 330 processes the digital image signals converted by the plurality of analog-to-digital conversion units 320. As the process, for example, a rearranging process of image signals can be performed. The processed image signals are horizontally transferred and output to the signal line 301. The horizontal transfer is a method of sequentially transferring digital image signals in an order from a digital image signal converted by the analog-to-digital conversion unit 320 arranged at the left end in the drawing, for example.

[Configuration of Analog-to-Digital Conversion Unit]

Figure 4:
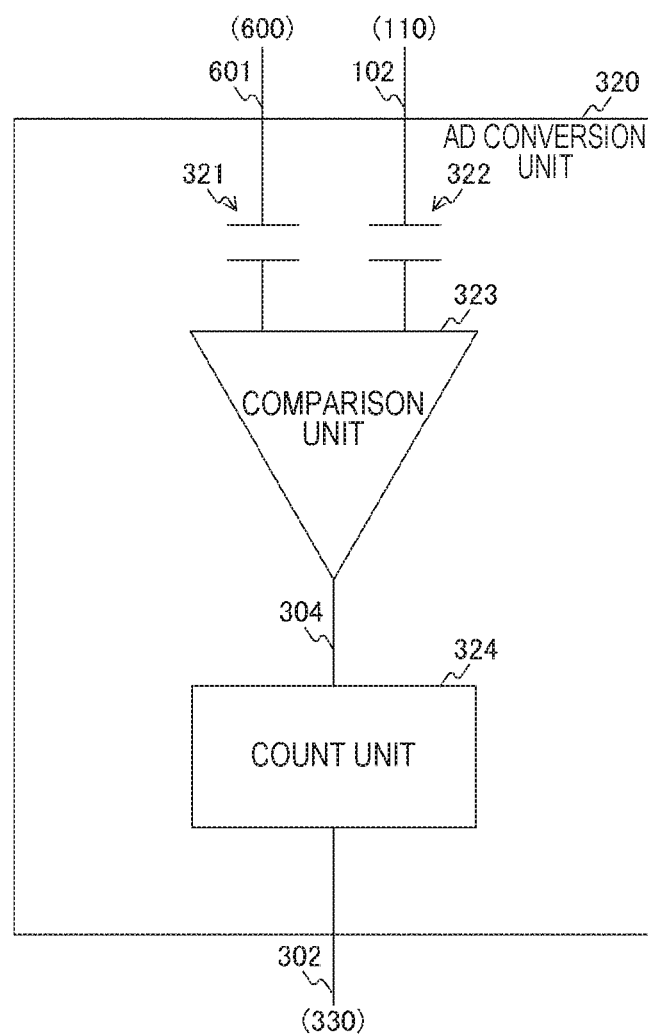
FIG. 4 is a diagram illustrating a configuration example of an analog-to-digital conversion unit 320 in an embodiment of the present technology.

FIG. 4 is a diagram illustrating a configuration example of the analog-to-digital conversion unit 320 in an embodiment of the present technology. The analog-to-digital conversion unit 320 includes capacitors 321 and 322, a comparison unit 323, and a count unit 324.

The capacitors 321 and 322 are capacitors that transmit image signals or the like to inputs of the comparison unit 323 by alternating-current coupling. The capacitor 321 is connected to between the signal line 601 and the input of the comparison unit 323, and performs transmission of a signal obtained by removing an amount corresponding to direct current of a reference signal. The capacitor 322 is connected to between the signal lines 102 and another input of the comparison unit 323, and performs transmission of a signal obtained by removing an amount corresponding to direct current of an analog image signal.

The comparison unit 323 compares the analog image signal and the reference signal that have been input via the capacitors 321 and 322, and performs detection of match between the analog image signal and the reference signal. A detection result is output to the count unit 324 via a signal line 304. The comparison unit 323 can output a comparison result by outputting a value "1" in a case where a voltage of the reference signal is higher than a voltage of the analog image signal, and outputting a value "0" in a case where the voltage of the reference signal is lower than the voltage of the analog image signal, for example.

The count unit 324 counts a time until the match detection from the start of comparison in the comparison unit 323. Specifically, the count unit 324 starts counting in accordance with a start of the comparison in the comparison unit 323, and stops counting in accordance with match detection in the comparison unit 323. At this time, the count unit 324 can detect match between the analog image signal and the reference signal by detecting a transition of an output value of the comparison unit 323 from "1" o "0". After that, the count unit 324 outputs a count value as a digital image signal. In addition, the count unit 324 can also perform correlated double sampling (CDS). The CDS is processing of removing noise unique to each of the pixels 110 arranged in the pixel array unit 100. The count unit 324 can perform the CDS by performing counting up and counting down, for example. The details of the analog-to-digital conversion process in the analog-to-digital conversion unit 320 will be described later.

[Configuration of Reference Signal Generation Unit]

Figure 5:
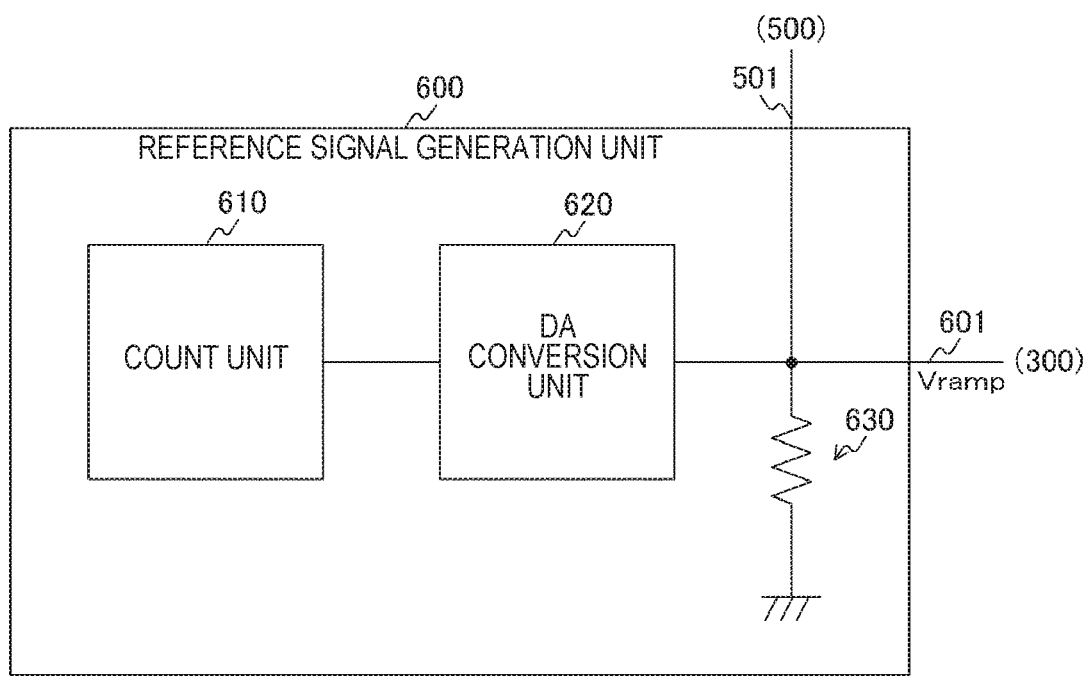
FIG. 5 is a diagram illustrating a configuration example of a reference signal generation unit 600 in an embodiment of the present technology.

FIG. 5 is a diagram illustrating a configuration example of the reference signal generation unit 600 in an embodiment of the present technology. The reference signal generation unit 600 includes a count unit 610, a digital-to-analog (DA) conversion unit 620, and a resistor 630.

The count unit 610 performs counting of a period from a start to an end of reference signal generation, and sequentially outputs a count value to the digital-to-analog conversion unit 620. The count unit 610 can perform counting in synchronization with the above-described count unit 324. The count unit 610 in the drawing is assumed to perform counting down.

The digital-to-analog conversion unit 620 performs digital-to-analog conversion of the count value output from the count unit 610. The digital-to-analog conversion unit 620 outputs an electric current corresponding to an input digital signal (count value). An electric current having a value varying (declining) in a ramp shape is thereby generated. The electric current flows in the resistor 630 via the signal line 601.

The resistor 630 is a resistor that converts the electric current output from the digital-to-analog conversion unit 620, into a voltage. By the conversion, a reference signal (Vramp) having a voltage varying (declining) in a ramp shape is generated. In addition, a correction signal is applied to the resistor 630 from the reference signal correction unit 500 via the signal line 501. As described later, the correction signal is a signal for flowing an electric current corresponding to a correction amount, and by the correction signal flowing in the resistor 630, a voltage of the reference signal can be corrected.

[Configuration of Reference Signal Correction Unit]

Figure 6:
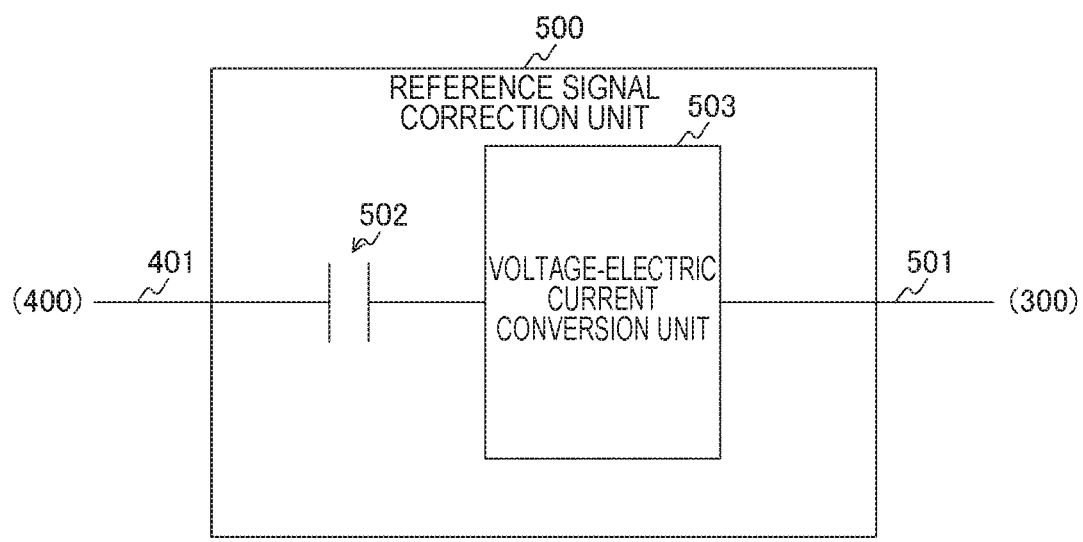
FIG. 6 is a diagram illustrating a configuration example of a reference signal correction unit 500 in an embodiment of the present technology.

FIG. 6 is a diagram illustrating a configuration example of the reference signal correction unit 500 in an embodiment of the present technology. The reference signal correction unit 500 includes a capacitor 502 and a voltage-electric current conversion unit 503.

The capacitor 502 is a capacitor that is connected to between the power line 401 and an input of the voltage-electric current conversion unit 503, and transmits only an amount corresponding to a fluctuation in a negative voltage supplied by the negative voltage power source unit 400, by alternating-current coupling.

The voltage-electric current conversion unit 503 converts a fluctuation in negative voltage power input via the capacitor 502, into a fluctuation in an electric current. The voltage-electric current conversion unit 503 outputs the converted electric current to the reference signal generation unit 600 as a correction signal.

In this manner, in an embodiment of the present technology, even in a case where an image signal fluctuates due to a fluctuation in a voltage of a negative voltage power source, the fluctuation in the image signal can be cancelled by detecting the fluctuation and correcting the reference signal. This can prevent deterioration in image quality while downsizing an imaging apparatus.

2. Operation of Embodiment

Next, an operation of the imaging apparatus 10 in an embodiment of the present technology will be described.

[Generation of Digital Image Signal]

Figure 7:
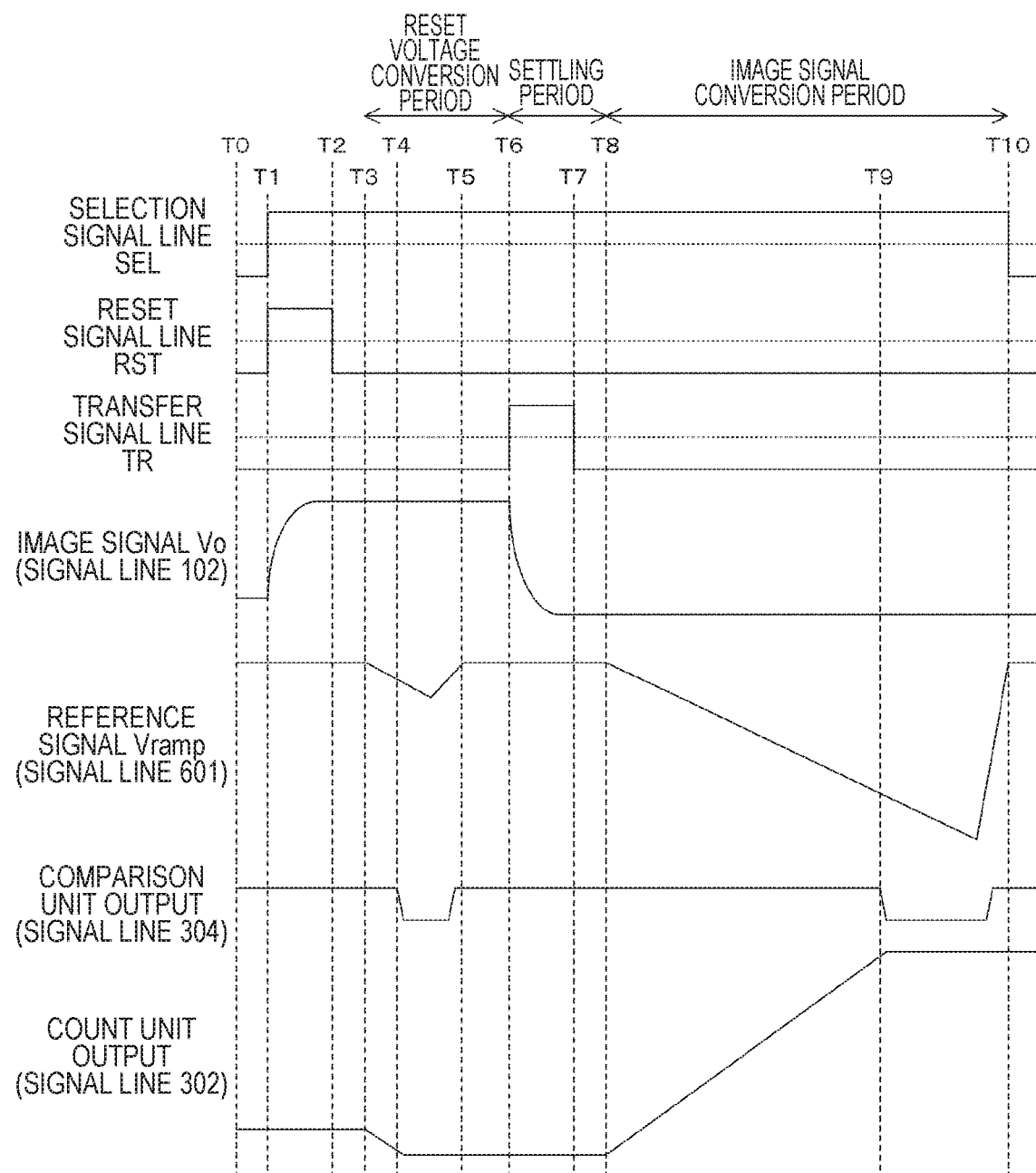
FIG. 7 is a diagram illustrating an example of a generation process of a digital image signal in an embodiment of the present technology.

FIG. 7 is a diagram illustrating an example of a generation process of a digital image signal in an embodiment of the present technology. The drawing illustrates a process from outputting of an analog image signal to analog-to-digital conversion in the pixel 110.

In the drawing, a selection signal line SEL, a reset signal line RST, and a transfer signal line TR respectively indicate control signals of the selection signal line SEL, the reset signal line RST, and the transfer signal line TR. In addition, horizontal broken lines in the drawing indicate electrical potentials of 0 V in these control signals. As described in FIG. 2, by these control signals, a positive-polarity on voltage and a negative-polarity off voltage are applied to the image signal output unit 115 or the like. An image signal Vo and a reference signal Vramp respectively indicate waveforms of an analog image signal output from the image signal output unit 115 and a reference signal corrected by the reference signal correction unit 500. A comparison unit output indicates an output (comparison result) of the comparison unit 323. A count unit output indicates a digital signal (count value) output from the count unit 324.

In T0 to T1, an off voltage is applied to the selection signal line SEL, the reset signal line RST, and the transfer signal line TR. The period corresponds to an initial state, and the image signal output unit 115, the reset unit 113, and the electric charge transfer unit 112 enter the nonconductive state. In the period, photoelectric conversion is performed by the photoelectric conversion unit 111, and a generated electric charge is held in the photoelectric conversion unit 111.

In T1 to T2, an on voltage is input from the selection signal line SEL, and the image signal output unit 115 enters the conductive state. Note that the input of the on voltage from the selection signal line SEL continues up to T10. This starts outputting of an analog image signal corresponding to the electric charge held in the electric charge holding unit 116, to the signal line 102. At the same time, an on voltage is input from the reset signal line RST, and the reset unit 113 enters the conductive state. This resets the electric charge holding unit 116. As illustrated in the drawing, the image signal Vo rises to a voltage at the time of reset.

In T2 to T6, the application of the on voltage to the reset signal line RST is stopped and an off voltage is applied thereto. The reset thereby ends and an analog image signal obtained at the time of the reset is output as an image signal Vo. After that, outputting of the reference signal Vramp to the signal line 601 is started, and the count unit 324 starts counting down (T3). When the reference signal Vramp declines to become equal to the analog image signal Vo, match between these is detected and output by the comparison unit 323 (T4 to T5). When the count unit 324 detects a transition of a comparison unit output value from "1" to "0", the count unit 324 stops counting (T4). After that, the count unit 324 holds a count value obtained at the time. Note that a voltage of the analog image signal obtained at the time of reset is referred to as a reset voltage. In addition, a period from T3 to T6 corresponds to a reset voltage conversion period.

In T6 to T8, an on voltage is applied from the transfer signal line TR and the electric charge transfer unit 112 enters the conductive state. This transfers the electric charge held in the photoelectric conversion unit 111, to the electric charge holding unit 116, and holds the electric charge in the electric charge holding unit 116. An analog image signal Vo corresponding to the electric charge held in the electric charge holding unit 116 is output to the signal line 102. After that, after the image signal Vo stabilizes, the application of the on voltage to the transfer signal line TR is stopped and an off voltage is applied thereto (T7). A period from T6 to T8 corresponds to a settling period of the image signal Vo.

In T8 to T10, outputting of the reference signal Vramp to the signal line 601 is restarted and the count unit 324 starts counting up (T8). In a similar manner to T4 described above, when the reference signal Vramp becomes equal to the analog image signal Vo, match between these is detected by the comparison unit 323, and the count unit 324 stops counting (T9). After that, outputting of the reference signal Vramp to the signal line 601 is stopped. In this manner, the CDS is executed by counting down and counting up in the count unit 324. An output of the count unit 324 that is obtainable after the execution of the CDS corresponds to a digital image signal obtainable after analog-to-digital conversion. After that, the application of the on voltage from the selection signal line SEL is stopped and an off voltage is applied thereto (T10). This ends the process of analog-to-digital conversion.

These processes are sequentially performed for each row of the pixels 110 arranged in the pixel array unit 100. By performing the above-described processes for all the rows, image signals corresponding to one screen can be obtained.

[Fluctuation in Image Signal]

Figure 8:
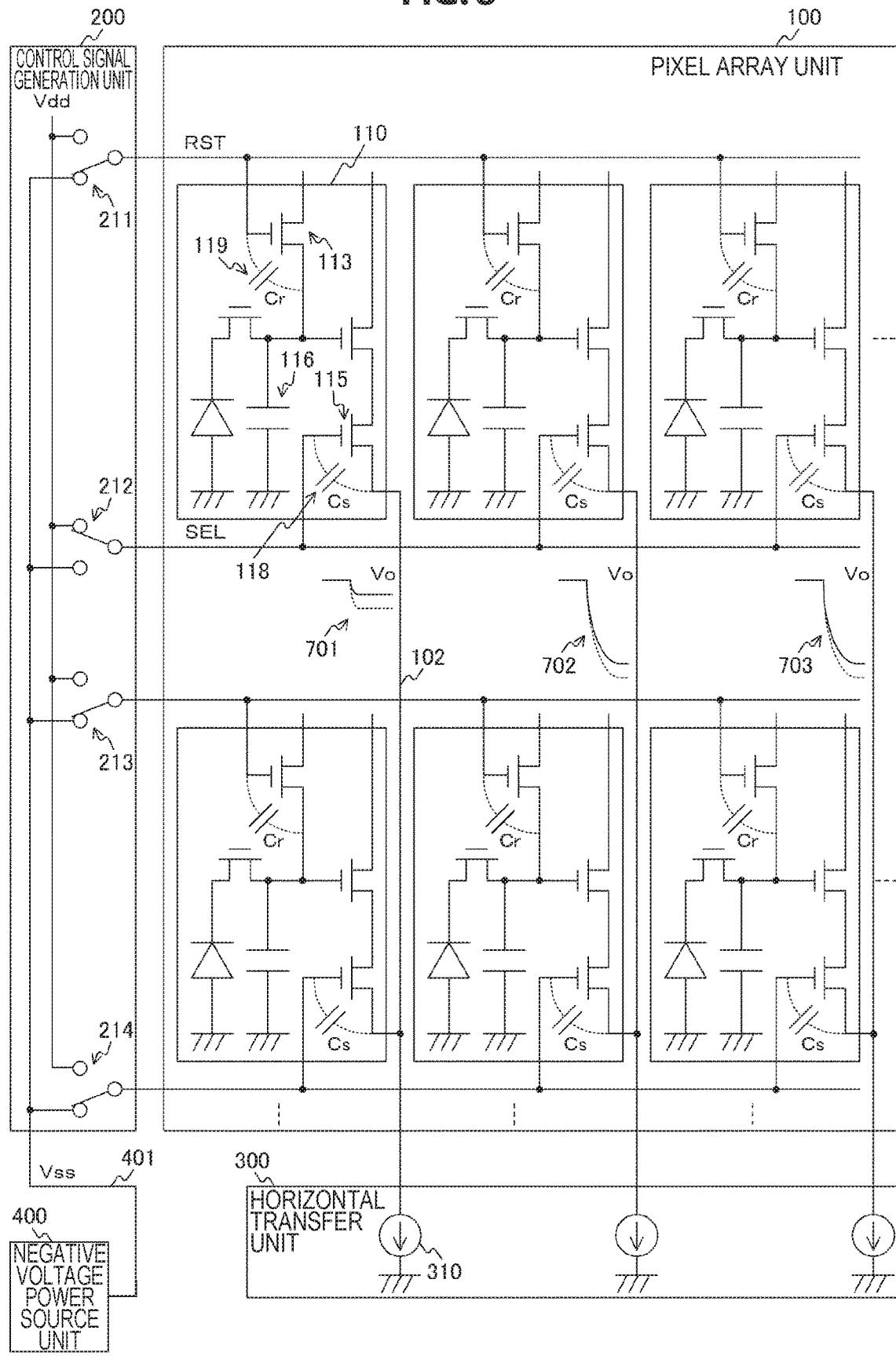
FIG. 8 is a diagram illustrating a fluctuation in an image signal in an embodiment of the present technology.

FIG. 8 is a diagram illustrating a fluctuation in an image signal in an embodiment of the present technology. The drawing is a schematic diagram illustrating a relationship between an analog image signal and a control signal that are output from the pixel 110 in the period from T5 to T7 that has been described in FIG. 7. In addition, the drawing schematically illustrates the pixels 110 arranged in a first row and a second row in the pixel array unit 100 described in FIG. 1, the control signal generation unit 200, the horizontal transfer unit 300, and the negative voltage power source unit 400. In addition, negative-polarity power supplied by the negative voltage power source unit 400 is denoted by Vss. In the drawing, it is assumed that outputting of image signals is performed in the pixels 110 arranged in the first row. The row in which the outputting of image signals is performed is referred to as a selected row, and the other rows are referred to as unselected rows.

A parasitic capacitance exists between a gate and a source of a MOS transistor forming the reset unit 113 or the like. A parasitic capacitance (Cr) 119 and a parasitic capacitance (Cs) 118 in the drawing respectively indicate parasitic capacitances of the reset unit 113 and the image signal output unit 115. Variations in voltages on gate sides and source sides of MOS transistors are bidirectionally transmitted via the parasitic capacitances.

For simplifying the description, the control signal generation unit 200 in the drawing is assumed to apply an on voltage and an off voltage to signal lines by switching Vdd and Vss using switches 211 to 214, and control the reset unit 113 and the image signal output unit 115.

In T5 to T6 in FIG. 7, the switches 211 to 214 are switched to a Vss side, and an off voltage is applied to the image signal output unit 115 and the reset unit 113 of each of the pixels 110. Next, the control signal generation unit 200 switches the switch 212 to a Vdd side and applies an on voltage to the selection signal line SEL of the first row being a selected row (T6 to T7 in FIG. 7). As a result, an analog image signal Vo is output from the pixels 110 arranged in the first row, and a voltage of the signal line 102 varies. A voltage of the analog image signal Vo has a value corresponding to light emitted to a pixel, and the analog image signal Vo has a lower voltage as an amount of light emitted to the pixel 110 is larger. In the drawing, a case where light with a smaller light amount is emitted to the pixel 110 arranged in a first column of the first row, and light with a relatively larger light amount is emitted to the pixels 110 arranged in second and third columns of the first row is assumed. Waveforms 701 to 703 in the drawing indicate states of voltages when voltages of the signal lines 102 vary from a reset voltage to an analog image signal Vo. As compared with the signal line 102 arranged in the first column, voltages of the signal lines 102 arranged in the second and third columns vary largely.

The signal lines 102 are connected also to the pixels 110 in unselected rows, and variations in voltages of the signal lines 102 propagate to the negative voltage power source unit 400 via the parasitic capacitances 118 of the pixels 110 in the unselected rows and the switch 214. In the drawing, by a decline in voltages of the signal lines 102, Vss declines (absolute value rises). By a decline in Vss, an amount of electric charges held in the electric charge holding unit 116 in the selected row that is connected via the switch 211 and the parasitic capacitance 119 increases, and a voltage of an analog image signal output from the image signal output unit 115 further declines. The further decline in the voltage of the analog image signal is similarly generated in all the pixels 110 arranged in the selected row. Broken lines of the waveforms 701 to 703 in the drawing indicate waveforms of image signals that are obtainable when voltages decline. In addition, because Vss declines in proportion to amounts of variations in voltages of the signal lines 102, and a further decline in the voltages of the analog image signals is caused, as an amount of light emitted to a pixel is larger, a voltage of an analog image signal declines. Thus, a row that outputs many analog image signals of bright images has higher brightness as compared with the other rows, and so-called whitening is caused. In this manner, whitening different for each row is caused, and image quality declines.

[Correction of Reference Signal]

Figure 9:
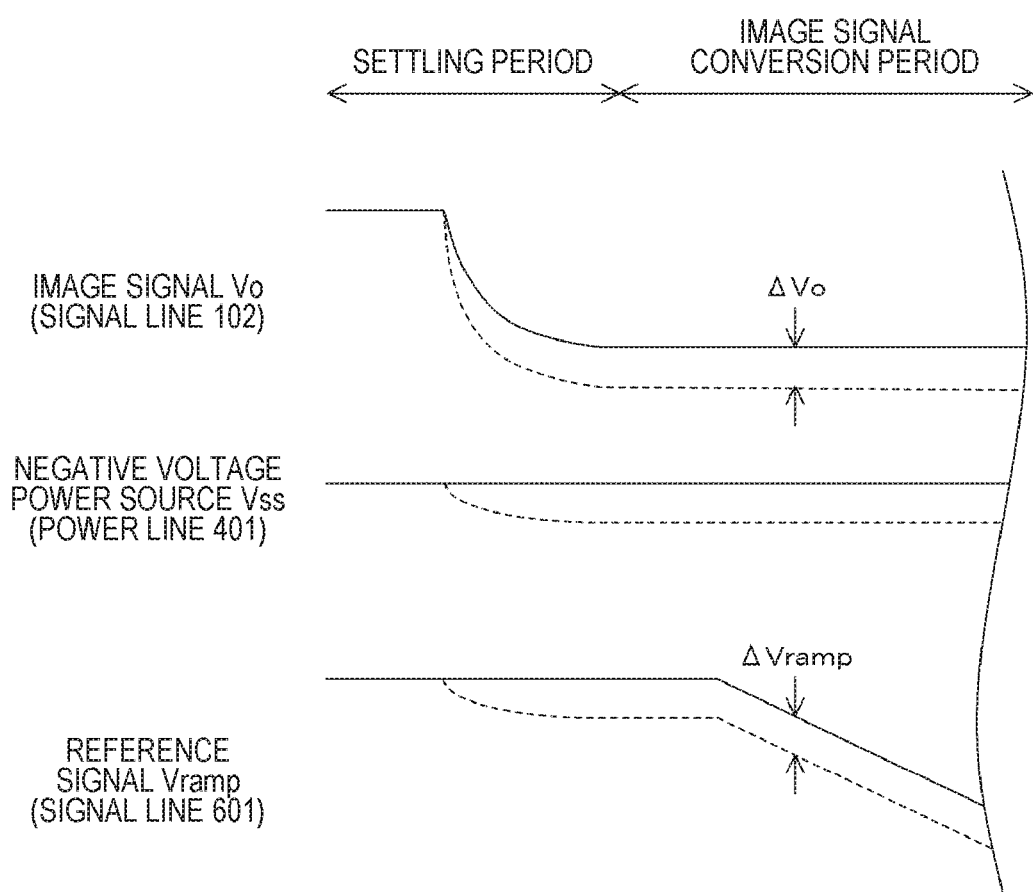
FIG. 9 is a diagram illustrating correction of a reference signal in an embodiment of the present technology.

FIG. 9 is a diagram illustrating correction of a reference signal in an embodiment of the present technology. The drawing illustrates a state of correction of a reference signal in the reference signal correction unit 500. In addition, the drawing illustrates waveforms of an analog image signal Vo, a negative voltage power source Vss, and a reference signal Vramp in the settling period and an image signal conversion period that have been described in FIG. 7.

As described above, the analog image signal Vo output from the image signal output unit 115 declines in voltage due to a variation in a voltage of itself. Broken lines in the drawing indicate waveforms of the image signals that are obtainable after the decline, and ΔVo denotes a decline amount. By the ΔVo, whitening is caused. In addition, Vss declines in a similar manner. The reference signal correction unit 500 detects the decline in Vss, and lowers the voltage of the reference signal Vramp in accordance with the decline amount, thereby correcting the reference signal. In the drawing, a correction amount of the reference signal is denoted by ΔVramp. By making the ΔVramp and ΔVo equal, a decline in a voltage of a digital image signal obtained after analog-to-digital conversion can be compensated for.

[Circuit Configuration of Reference Signal Correction Unit]

Figure 10:
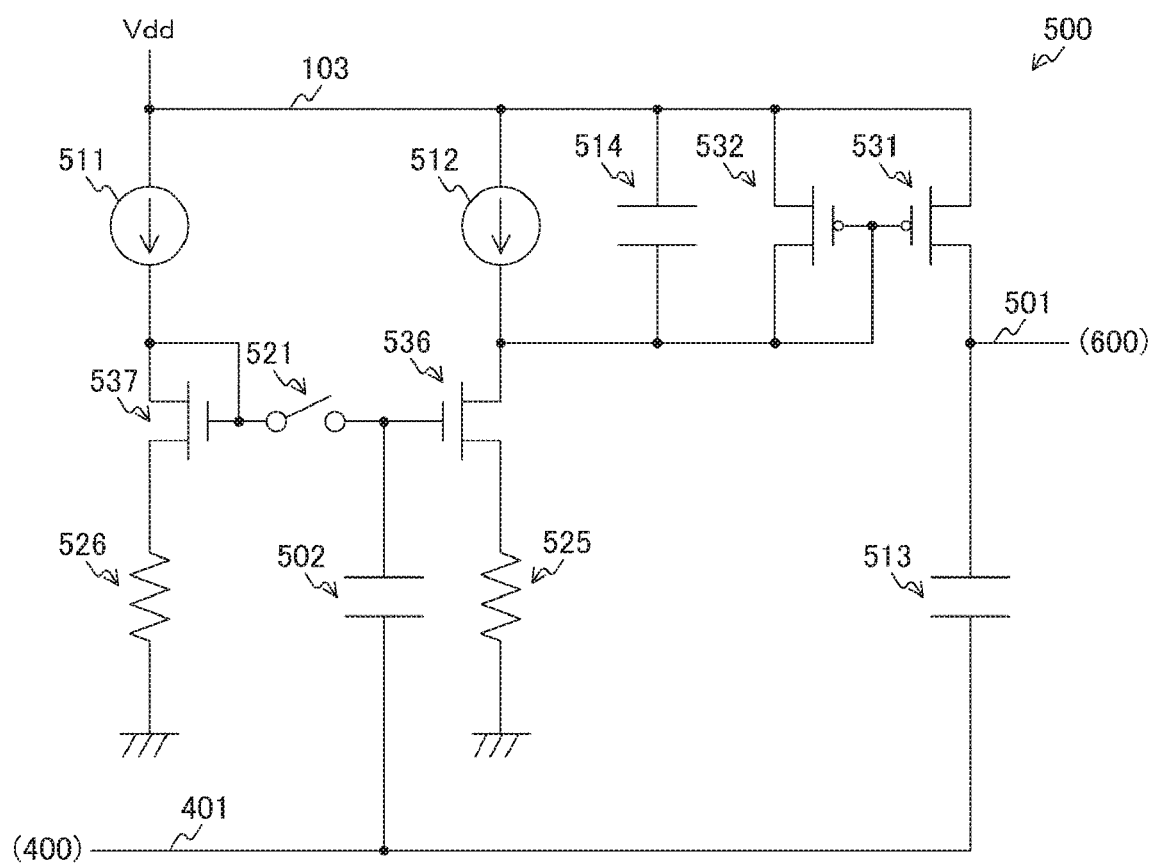
FIG. 10 is a diagram illustrating a circuit example of the reference signal correction unit 500 in an embodiment of the present technology.

FIG. 10 is a diagram illustrating a circuit example of the reference signal correction unit 500 in an embodiment of the present technology. The drawing illustrates a specific circuit corresponding to the voltage-electric current conversion unit 503 of the reference signal correction unit 500 that has been described in FIG. 6.

The reference signal correction unit 500 in the drawing includes constant electric current power sources 511 and 512, capacitors 502, 513, and 514, resistors 526 and 525, a switch element 521, and MOS transistors 531, 532, 536, and 537. P-channel MOS transistors can be used as the MOS transistors 531 and 532. N-channel MOS transistors can be used as the MOS transistors 536 and 537.

A source of the MOS transistor 537 is grounded via the resistor 526. A drain and a gate of the MOS transistor 537 and one end of the switch element 521 are connected in common to one end of the constant electric current power source 511. Another end of the constant electric current power source 511 is connected to the power line 103, and another end of the switch element 521 is connected to a gate of the MOS transistor 536 and one end of the capacitor 502. Another end of the capacitor 502 is connected to the power line 401. A source of the MOS transistor 536 is grounded via the resistor 525. A drain and a gate of the MOS transistor 532, a gate of the MOS transistor 531, one end of the capacitor 514, and one end of the constant electric current power source 512 are connected in common to a drain of the MOS transistor 536. Another end of the capacitor 514 and another end of the constant electric current power source are connected to the power line 103. Sources of the MOS transistors 531 and 532 are connected to the power line 103. A drain of the MOS transistor 531 is connected to the signal line 501 and one end of the capacitor 513. Another end of the capacitor 513 is connected to the power line 401.

The MOS transistor 536 is a transistor that amplifies an amount corresponding to a fluctuation in negative voltage power input via the capacitor 502 described in FIG. 6. A circuit including the constant electric current power source 511, the MOS transistor 537, the resistor 526, and the switch element 521 is a circuit that applies a bias voltage to a base of the MOS transistor 536. By closing a contact point of the switch element 521, a bias voltage is supplied to the base of the MOS transistor. When an amount corresponding to a fluctuation in negative voltage power is amplified, a contact point of the switch element 521 is opened, and a bias circuit and the base of the MOS transistor 536 are cut off from each other. The resistor 525 is a resistor that defines an operating point of the MOS transistor 536. The constant electric current power source 512 forms a drain load of the MOS transistor 536. The capacitor 514 is a capacitor for adjusting a lagging phase.

In the MOS transistor 532, an electric current corresponding to a fluctuation in a negative power source voltage that has been amplified by the MOS transistor 536 flows. The MOS transistor 531 forms a current mirror circuit together with the MOS transistor 532, and flows the same electric current as the electric current flowing in the MOS transistor 532, in the signal line 501. The electric current becomes a correction signal described in FIG. 6. Note that the capacitor 513 is a capacitor for adjusting a leading phase.

In this manner, by extracting an amount corresponding to a fluctuation in the negative voltage power source unit 400, by the capacitor 502, and inputting the amount to the gate of the MOS transistor 536, correction of the reference signal can be performed without increasing a load of the negative voltage power source unit 400.

Figure 11:
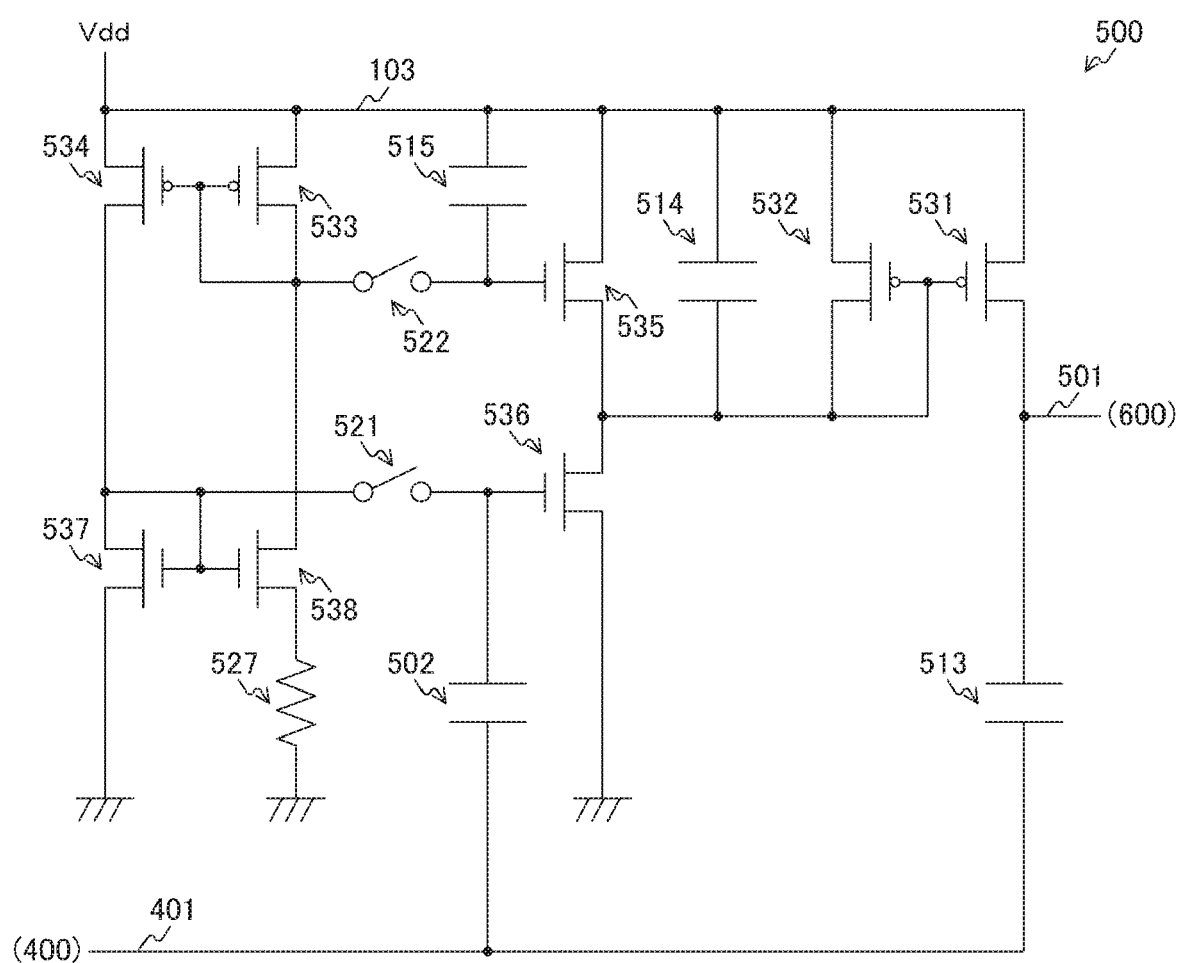
FIG. 11 is a diagram illustrating another example of a circuit of the reference signal correction unit 500 in an embodiment of the present technology.

FIG. 11 is a diagram illustrating another example of a circuit of the reference signal correction unit 500 in an embodiment of the present technology. The reference signal correction unit 500 in the drawing is a circuit to which a circuit that makes constant mutual conductance of the MOS transistor 536 in the circuit of the reference signal correction unit 500 that has been described in FIG. 10 is added. In the drawing, the same structural elements as those in the reference signal correction unit 500 in FIG. 10 are denoted with the same reference numerals.

The reference signal correction unit 500 in the drawing includes capacitors 502, 513, 514, and 515, switch elements 521 and 522, a resistor 527, and MOS transistors 531 to 538. P-channel MOS transistors can be used as the MOS transistors 531 to 534. N-channel MOS transistors can be used as the MOS transistors 535 to 538.

Sources of the MOS transistors 533 and 534 are connected to the power line 103. A drain of the MOS transistor 533 is connected to gates of the MOS transistors 537 and 538 and one end of the switch element 521. Another end of the switch element 521 is connected to a gate of the MOS transistor 536 and one end of the capacitor 502. Another end of the capacitor 502 is connected to the power line 401. A source of the MOS transistor 537 is grounded. A gate of the MOS transistor 534 is connected to a gate and a drain of the MOS transistor 533, a drain of the MOS transistor 538, and one end of the switch element 522. Another end of the switch element 522 is connected to a gate of the MOS transistor 535 and one end of the capacitor 515. Another end of the capacitor 515 is connected to the power line 103.

A source of the MOS transistor 538 is grounded via the resistor 527. A source of the MOS transistor 536 is grounded. A drain of the MOS transistor 536 is connected to a drain of the MOS transistor 535, a drain and a gate of the MOS transistor 532, a gate of the MOS transistor 531, and one end of the capacitor 514. Another end of the capacitor 514 and sources of the MOS transistors 535, 532, and 531 are connected to the power line 103. A drain of the MOS transistor 531 is connected to the signal line 501 and one end of the capacitor 513. Another end of the capacitor 513 is connected to the power line 401.

The reference signal correction unit 500 in the drawing corresponds to that obtained by changing the bias circuit in the reference signal correction unit 500 that has been described in FIG. 10. In the drawing, a circuit including the switch elements 521 and 522, the resistor 527, and the MOS transistors 533, 534, 537, and 538 corresponds to a bias circuit. Among these, a circuit including the resistor 527 and the MOS transistors 533, 534, 537, and 538 is a circuit that sets a mutual conductance to a constant value. In addition, as a drain load of the MOS transistor 536, the MOS transistor 535 is used in place of the constant electric current power source 512. The capacitor 515 is a capacitor for phase compensation.

In this manner, according to an embodiment of the present technology, by detecting a fluctuation in an off voltage that is caused when an image signal is output, and correcting a reference signal, a fluctuation in the image signal can be reduced. This can prevent a decline in image quality in a case where a voltage of a negative power source fluctuates.

The above-described embodiments are examples for embodying the present technology, and matters in the embodiments each have a corresponding relationship with disclosure-specific matters in the claims. Likewise, the matters in the embodiments and the disclosure-specific matters in the claims denoted by the same names have a corresponding relationship with each other. However, the present technology is not limited to the embodiments, and various modifications of the embodiments may be embodied in the scope of the present technology without departing from the spirit of the present technology.

The processing sequences that are described in the embodiments described above may be handled as a method having a series of sequences or may be handled as a program for causing a computer to execute the series of sequences and recording medium storing the program. As the recording medium, a CD (Compact Disc), an MD (MiniDisc), and a DVD (Digital Versatile Disc), a memory card, and a Blu-ray disc (registered trademark) can be used.

Note that the effects described in the present specification are not necessarily limited, and any effect described in the present disclosure may be exhibited.

Additionally, the present technology may also be configured as below.

(1)

An image sensor including:

an electric charge holding unit configured to hold an electric charge generated in accordance with light emitted for each pixel;

an image signal output unit configured to be controlled in accordance with a first control signal indicating either voltage state of an on voltage for causing a conductive state and an off voltage having a polarity different from that of the on voltage, and output an analog image signal corresponding to the held electric charge in the conductive state;

a reset unit configured to be controlled in accordance with a second control signal indicating either voltage state of the on voltage and the off voltage, reset the electric charge holding unit in the conductive state, transmit a fluctuation in the off voltage to the electric charge holding unit, and fluctuate the analog image signal;

a reference signal generation unit configured to generate a reference signal being a signal serving as a reference used when conversion from an analog image signal output from the image signal output unit into a digital image signal is performed;

a reference signal correction unit configured to correct the generated reference signal in accordance with the fluctuation in the off voltage; and an analog-to-digital conversion unit configured to perform the conversion on the basis of the corrected reference signal.

(2)

The image sensor according to (1), in which the reset unit transmits the fluctuation in the off voltage to the electric charge holding unit via a parasitic capacitance of itself.

(3)

The image sensor according to (1) or (2), in which the reference signal correction unit corrects the generated reference signal in accordance with a fluctuation in a voltage of a power source that supplies the off voltage.

(4)

The image sensor according to any of (1) to (3), in which the analog-to-digital conversion unit includes a comparison unit configured to perform detection of match between the analog image signal and the reference signal by comparing the analog image signal and the reference signal, and a count unit configured to perform counting in a period from a start of the comparison to the detection in the comparison unit, and output a count value as the digital image signal.

(5)

The image sensor according to any of (1) to (4), including:

a plurality of pixels arranged in a matrix and each including the image signal output unit; and a plurality of the analog-to-digital conversion units each configured to perform the conversion on the analog image signals output from the respective image signal output units of a plurality of the pixels arranged in one row, in which the reference signal correction unit supplies the same corrected reference signal to each of the plurality of analog-to-digital conversion units.

(6)

An imaging apparatus including:

an electric charge holding unit configured to hold an electric charge generated in accordance with light emitted for each pixel;

an image signal output unit configured to be controlled in accordance with a first control signal indicating either voltage state of an on voltage for causing a conductive state and an off voltage having a polarity different from that of the on voltage, and output an analog image signal corresponding to the held electric charge in the conductive state;

a reset unit configured to be controlled in accordance with a second control signal indicating either voltage state of the on voltage and the off voltage, reset the electric charge holding unit in the conductive state, transmit a fluctuation in the off voltage to the electric charge holding unit, and fluctuate the analog image signal;

a reference signal generation unit configured to generate a reference signal being a signal serving as a reference used when conversion from an analog image signal output from the image signal output unit, into a digital image signal is performed;

a reference signal correction unit configured to correct the generated reference signal in accordance with the fluctuation in the off voltage;

an analog-to-digital conversion unit configured to perform the conversion on the basis of the corrected reference signal; and a processing circuit configured to process a digital image signal on which the conversion has been performed.

REFERENCE SIGNS LIST 10 imaging apparatus
100 pixel array unit
110 pixel
111 photoelectric conversion unit
112 electric charge transfer unit
113 reset unit
114 image signal generation unit
115 image signal output unit
116 electric charge holding unit
118, 119 parasitic capacitance
200 control signal generation unit
211 to 214 switch
300 horizontal transfer unit
310 constant electric current power source
320 analog-to-digital conversion unit
321, 322, 502, 513 to 515 capacitor
323 comparison unit
324, 610 count unit
330 image signal transfer unit
400 negative voltage power source unit
500 reference signal correction unit
503 voltage-electric current conversion unit
511, 512 constant electric current power source
521, 522 switch element
525 to 527, 630 resistor
531 to 538 MOS transistor
600 reference signal generation unit
620 digital-to-analog conversion unit

The invention claimed is:

1. An image sensor, comprising:

an electric charge holding unit configured to hold an electric charge generated in accordance with light emitted for each pixel;

an image signal output unit configured to be controlled in accordance with a first control signal indicating either a voltage state of an on voltage that causes a conductive state and an off voltage having a polarity different from that of the on voltage, and output an analog image signal corresponding to the held electric charge in the conductive state;

a reset unit configured to be controlled in accordance with a second control signal indicating either the voltage state of the on voltage and the off voltage, reset the electric charge holding unit in the conductive state, transmit a fluctuation in the off voltage to the electric charge holding unit, and fluctuate the analog image signal;

a reference signal generation unit configured to generate a reference signal being a signal serving as a reference used when conversion from an analog image signal output from the image signal output unit into a digital image signal is performed;

a reference signal correction unit configured to correct the generated reference signal in accordance with the fluctuation in the off voltage; and an analog-to-digital conversion unit configured to perform the conversion based on the corrected reference signal.

2. The image sensor according to claim 1, wherein the reset unit is further configured to transmit the fluctuation in the off voltage to the electric charge holding unit via a parasitic capacitance of itself.

3. The image sensor according to claim 1, wherein the reference signal correction unit is further configured to correct the generated reference signal in accordance with a fluctuation in a voltage of a power source that supplies the off voltage.

4. The image sensor according to claim 1, wherein the analog-to-digital conversion unit includes:

a comparison unit configured to perform detection of match between the analog image signal and the reference signal by comparison of the analog image signal and the reference signal, and a count unit configured to perform counting in a period from a start of the comparison to the detection in the comparison unit, and output a count value as the digital image signal.

5. The image sensor according to claim 1, further comprising:

a plurality of pixels arranged in a matrix and each including the image signal output unit; and a plurality of analog-to-digital conversion units each configured to perform the conversion on analog image signals output from respective image signal output units of the plurality of pixels arranged in one row, wherein the reference signal correction unit is further configured to supply the same corrected reference signal to each of the plurality of analog-to-digital conversion units.

6. An imaging apparatus, comprising:

an electric charge holding unit configured to hold an electric charge generated in accordance with light emitted for each pixel;

an image signal output unit configured to be controlled in accordance with a first control signal indicating either a voltage state of an on voltage that causes a conductive state and an off voltage having a polarity different from that of the on voltage, and output an analog image signal corresponding to the held electric charge in the conductive state;

a reset unit configured to be controlled in accordance with a second control signal indicating either the voltage state of the on voltage and the off voltage, reset the electric charge holding unit in the conductive state, transmit a fluctuation in the off voltage to the electric charge holding unit, and fluctuate the analog image signal;

a reference signal generation unit configured to generate a reference signal being a signal serving as a reference used when conversion from an analog image signal output from the image signal output unit, into a digital image signal is performed;

a reference signal correction unit configured to correct the generated reference signal in accordance with the fluctuation in the off voltage;

an analog-to-digital conversion unit configured to perform the conversion based on the corrected reference signal; and a processing circuit configured to process a digital image signal on which the conversion has been performed.

* * * * *